Oct. 25, 1955 R. N. HALL 2,721,965

POWER TRANSISTOR

Filed Dec. 29, 1952

Inventor:
Robert N. Hall,
by Paul A. Frank
His Attorney.

2,721,965
Patented Oct. 25, 1955

2,721,965

POWER TRANSISTOR

Robert N. Hall, Schenectady, N. Y., assignor to General Electric Company, a corporation of New York Application December 29, 1952, Serial No. 328,436
6 Claims. (Cl. 317—235)

Figure 1:
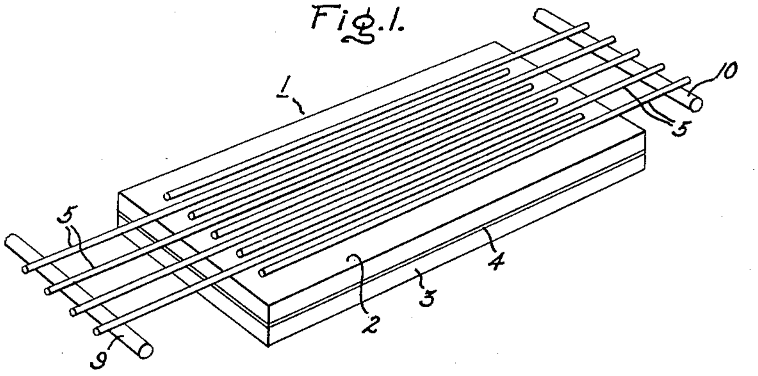

My invention relates to semi-conductor devices and more particularly to transistors of the P–N junction type.

Semi-conductors, such as germanium and silicon have been conventionally classified as either positive (P-type) or negative (N-type), depending primarily upon the type and sign of their predominant conduction carriers. Whether a particular semi-conductor body exhibits N-type or P-type characteristics lies primarily in the type of significant impurity elements or activators present in the semi-conductor. Some such activator elements, called donors, function to furnish additional free electrons to the semi-conductor so as to produce an N-type semi-conductor with an electronic excess, while others, called acceptors, function to absorb electrons from the semi-conductor to create P-type semi-conductors with an excess of positive conduction carriers or "positive holes." P–N junction semi-conductor units have a zone of P-type semi-conductor adjoining a zone of N-type semi-conductor to form an internal space charge barrier having a relatively large or broad area as distinguished from the point contact type of device. This junction possesses marked rectifying properites, as well as thermoelectric and photoelectric properties. A semi-conductor having a region of one conductivity type adjoining two regions of opposite conductivity type to form two P–N junctions can be used to make a three-terminal amplifying device known as a transistor. In such devices, the common zone is the base, and the zones adjoining are the emitter and collector respectively.

In the construction of P–N junctions, special care must be taken in providing electrodes or terminals for the three semi-conductor zones, and as a result, the devices are often fragile and difficult to assemble. Such structural problems are aggravated in the construction of transistors for operation at relatively high power levels since all the electrodes must be placed relatively close to each other for satisfactory high power operation, and each must have a relatively large area of contact with the semi-conductor body.

It is, therefore, a primary object of my invention to provide a junction transistor of improved construction.

It is another object of my invention to provide a multi-junction transistor for operation at relatively high power levels.

According to one aspect of my invention, a slab of semi-conducting material is provided with a base electrode on one side and a plurality of emitter and collector electrodes on the other side. The semi-conductor slab is of one conductivity type and the base electrode is in ohmic contact with it. The emitter and collector electrodes, however, include an activator element for providing conduction carriers of the other type, these electrodes being fused to the semi-conductor to transform a zone of the semi-conductor material adjoining each activator electrode to the opposite conductivity type whereby a rectifying junction is established between each zone and the remainder of the germanium slab. Since the collector and emitter electrodes are positioned side by side, their associated P–N junctions are also fairly closely spaced as is desired for high power operation. At the same time, by connecting alternate activator electrodes in parallel, the effectiveness of each junction as well as the total junction area is increased.

The novel features which are believed characteristic of the invention are set forth in the appended claims. The invention itself together with further objects and advantages therein may best be understood by reference to the following description taken in connection with the accompanying drawing in which, Fig. 1 is a perspective view of a P–N junction transistor embodying the invention, Fig. 2 is a cross-sectional view of a portion of the transistor of Fig. 1, and Fig. 3 is a perspective view of another P–N junction transistor embodying the invention.

Figure 2:
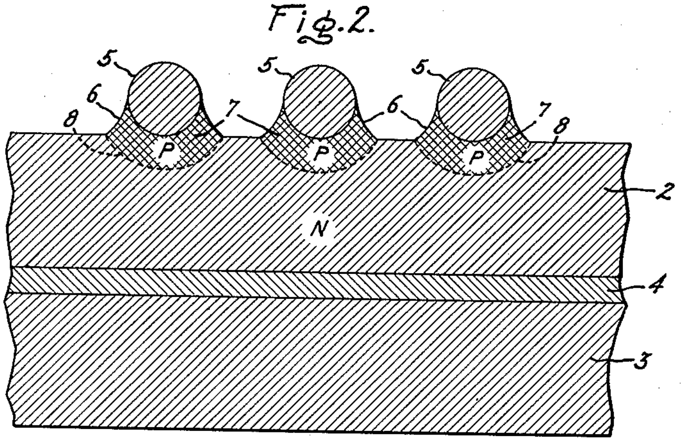
Figure 3:
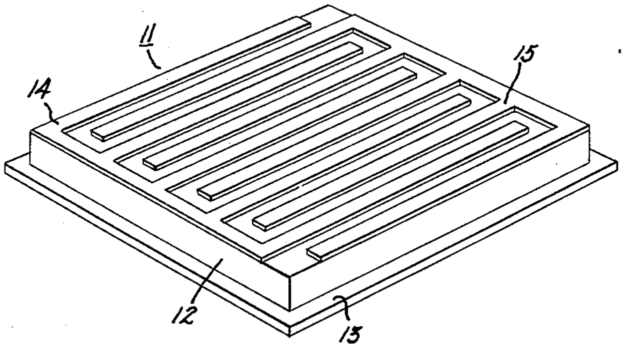

Referring now to Figs. 1 and 2, a transistor 1 is shown in which a rectangular slab or wafer 2 of N-type germanium comprises the main body of the device. A base electrode 3 is in good electrical contact with the under surface of the slab 2, this electrode 3 suitably being in the form of a metal plate which is soldered to the germanium slab 2. The solder layer 4 preferably, includes a donor activator such as antimony, in which case it would function through its contact with the germanium slab 2 as a reservoir source of available negative conduction carriers or electrons. The germanium slab 2 is initially provided with N-type conduction characteristics by being cut from a single crystal of germanium formed with a trace of a donor activator element such as antimony, phosphorous, or arsenic to give it negative or N-type conduction characteristics.

Emitter and collector electrodes are provided in good electrical contact with zones of semi-conductor material having P-type conduction characteristics near the upper surface of the germanium slab 2. These electrodes preferably take the form of a plurality of parallel rods or wires 5 made of nickel or other suitable material soldered in a grid-like array on the upper surface of the slab 2 and extending along a major dimension thereof. The nickel wires are bonded to the wafer 2 by a solder which thus forms a layer 6 of solder material between the lower portion of each wire or grid member and the surface of the germanium slab.

The solder comprising the layer 6 is selected to introduce positive conduction carriers in the germanium and preferably comprises indium or other acceptor activator element. When this acceptor activator is fused to the top surface of the germanium slab, the portions of it are diffused into the germanium with such concentration as to exceed the donor impurity concentration originally giving the germanium slab its N-type conduction characteristics. Thus a zone 7 of P-type semi-conductor material is created in the vicinity of each nickel wire 5. The depth of penetration of this zone into the germanium body is governed by the temperature and the duration of the heating process. This heating may be confined to the step of fusing the acceptor activator to the slab in the soldering process or the heating of the entire assembly may be continued at an elevated temperature to enlarge the zones of P-type material. The temperature employed ranges from 300 to 700° C. for germanium, and depends upon the particular activator element selected. The heating time may be anywhere from slightly less than one second to several minutes, suitable impregnation of the activator material into the semi-conductor body being accomplished when the activator solder "wets" the germanium slab. With an indium solder, temperatures in the neighborhood of 400° C. for a few minutes have been found sufficient. As the result of the diffusion or impregnation, the indium solder layers 6 which are in electrical contact with the respective electrodes 5, are brought into rectifying contact with the germanium slab, the rectifying barrier or P–N junction being the boundary 8 between each P type zone and the N type germanium body. The fused impurity method of producing P–N junctions is described and claimed in a patent application Serial No. 187,490 filed September 29, 1950, by W. C. Dunlap, Jr. and assigned to the assignee of the present application. The Dunlap application is to be regarded as prior art with respect to this present application.

Referring again to Fig. 1, it may be seen that four of the rods 5 extend beyond one end of the germanium slab 2 and are connected in parallel to an emitter bus terminal 9. The remaining grid rods 5 with which the four emitter electrodes are interleaved extend beyond the other end of the germanium slab 2 and are connected in parallel to a collector bus 10, and P–N junction 8 forms a fused contact rectifier having one of the grid rods or wires 5 as one terminal and the base electrode 3 as the other terminal.

The number of collector and emitter electrodes can be increased as desired, depending for the most part upon an economic size for the germanium slab. It is, of course, desirable that the array of electrodes cover most of one surface of the germanium. The germanium slab may be readily cooled by a fluid coolant in thermal contact with the base electrode.

For operation as a transistor, potentials are supplied to the sets of adjacent rectifiers so that one is operated in the forward direction as an emitter and the other is operated in the inverse or blocking direction as a collector. While adjacent P–N junctions 8 are spaced by a zone of N–type material between them, the passage of a forward current in the emitter circuit builds up a high concentration of holes and electrons in the germanium body 2 so that a fraction of the holes will diffuse to the collector contact rod 5 instead of to the base electrode. By providing a relatively close spacing between the grid rods and their associated junctions 8, it is possible for nearly all of the emitter current to appear in the collector circuit. Since the current is introduced in the emitter at a low impedance, and much of it appears in the relatively high impedance collector circuit, it is clear that high voltage and power gains are possible with the transistor operating as an amplifier even though the current gain is less than unity. The particular circuits in which such a transistor may be employed are known in the art and while not part of the present invention may be briefly described as being either of the base input or emitter input type, the base emitter, and collector electrodes corresponding respectively to the grid cathode, and anode electrodes of a triode amplifier.

In addition to having the grid rod electrodes 4 closely spaced, it is essential that none of them be high recombination rate contacts in order that surface and volume recombination and P and N conduction carriers be kept at a minimum. The thickness of the germanium slab or wafer 2 is accordingly preferably not greater than the spacing between the center to center spacing of the electrode rods 5. With such an arrangement, the minimum spacing between adjacent P–N junctions 8 can be conveniently maintained at a distance less substantially than the minimum spacing between a junction 8 and the base electrode 3 at the opposite side of the germanium slab or wafer. The base electrode is still placed sufficiently close to the other electrodes to permit satisfactory high power operation. Dimensions of a typical semi-conductor body 2, which are here given by way of example only since it is obvious that the size may be increased or decreased to accommodate operation at the desired power level, are approximately one-fourth inch square and 0.015″ thick, and 9 nickel wires approximately 0.010″ in diameter spaced .025″ between centers with approximately 0.010″ between each indium solder layer associated with each grid wire.

It is to be understood, of course, that various equivalent elements or combinations of elements may be substituted for those specifically described in relation to the embodiments of Fig. 1. Thus other acceptor activators, such as gallium or aluminum may be substituted for indium. A semi-conductor body having P-type conduction characteristics may also be employed in which case the grid rod solder would comprise a donor activator such as antimony, phosphorous, or arsenic. The semi-conductor body may itself be made of silicon instead of germanium. Likewise, of course, the number and configuration of the elongated grid-like electrodes can be increased, so long as they have large adjacent surfaces for producing closely spaced and effectively interleaved junctions. The activator elements in each case are chosen to provide conduction carriers in the adjoining semi-conductor material of an opposite sign to those of the zone associated with the base electrode. While these activator elements do not in themselves exhibit semi-conductor conduction characteristics, reference to their conductivity type is intended to indicate the type of conduction carriers they provide to a semi-conductor.

Another embodiment of my invention is illustrated in Fig. 3 where a power transistor 11 again comprises a slab of germanium 12, which is preferably cut from a single crystal of N-type material. A base electrode 13 is soldered or otherwise placed in good electrical contact with the lower major surface of the germanium slab and two sets of interleaving activator electrodes 14 and 15 are placed in rectifying contact with portions of the upper surface, the electrode 14 serving as an emitter electrode and the electrode 15 serving as the collector electrode.

Each of these electrodes 14 or 15 is made of a sheath or layer of indium or other acceptor impurity element having a connecting strap positioned along one edge of the upper surface of the germanium slab 12 and a plurality of spaced strips at right angles thereto and connected thereby extending in parallel array over the face of the germanium slab. The electrode assemblies 14 and 15 are positioned with their connecting straps on opposite sides of the upper surface of the slab so that their elongated electrode surfaces are interleaved. The electrode assemblies are preferably preformed, indium being preferably employed, and their lower surfaces are respectively fused to the surface of the germanium slab to impregnate the slab to a partial depth and thus provide a rectifying contact therewith.

The P–N junctions so formed are connected in alternate groups to the emitter or collector electrodes 14 and 15 which, because of the conductivity of the activator element, effectively serves to connect or provide good electrical contact to the P-type material produced by the fusion or impregnation of the germanium by some of the activator element. With such preformed electrodes, no supporting rod or grid is necessary. If desired, a second germanium slab corresponding to the slab 12 may be positioned over the assembly of Fig. 3 with an additional base electrode on its upper surface 13 so that the collector and emitter electrodes are sandwiched between two germanium slabs or wafers having a base electrode on each exposed major slab surface.

It is obvious that although my invention has been described in connection with specific embodiments, many modifications may be made without departing from the spirit of the invention. It is to be understood, therefore, that I intend by the appended claims to cover all such modifications as fall within the true spirit and scope of the invention.

What I claim as new and desire to secure by Letters Patent of the United States is:

1. A power transistor comprising a flat slab of semi-conductor material having opposing major surfaces, said material being of one conductivity type, a base electrode in electrical contact with one major surface of said slab, and a plurality of closely spaced activator contact members each making a large area contact with the other major surface of said slab, said activator contact members being alternately interconnected to form at least two electrodes electrically isolated from one another, said activator contact members comprising an activator element for providing conduction carriers of the opposite conductivity type to those of said slab and being fused to said surface to provide closely spaced zones of semiconductor material of said opposite conductivity type therein.

2. A transistor comprising a semi-conductor body having major dimensions much greater than its thickness dimension, said semi-conductor body comprising a zone of one conductivity type with a plurality of zones of the opposite conductivity type extending along one major surface of said body and to a partial depth within said body to define a like plurality of separate P–N junctions, emitter and collector electrodes in respective good conductive contact with alternate zones of said opposite conductivity type at said one major surface of said semi-conductor body, and a base electrode in good conductive contact with the zone of said one conductivity type of said semi-conductor body.

3. A transistor comprising a relatively thin slab of N-type germanium, a plurality of closely spaced alternately interconnected elongated electrodes each comprising an acceptor activator element for furnishing P-type conduction carriers fused to and with one major surface of said slab, and a third electrode in good conductive contact with at least a major portion of the other major surface of said slab.

4. A transistor comprising a relatively thin wafer of N-type germanium having a plurality of elongated parallel conductors separately soldered along their length to one major surface of said slab with a solder comprising an acceptor activator element for providing P-N junction forming contact with said N-type slab, and another electrode connected in good conductive contact with the other major surface of said slab.

5. A transistor comprising a relatively thin wafer of N-type germanium having a base electrode in good ohmic contact with at least a major portion of one of the major surfaces thereof, and a plurality of interleaved emitter and collector electrodes in respective good conductive contact with the other major surface of said slab, each of said emitter and collector electrodes comprising an acceptor activator element fused to said surface to create a zone of P-type germanium adjacent each electrode, the minimum spacing between adjacent P-type zones being smaller than the minimum spacing between said base electrode and a P-type zone.

6. A transistor comprising a relatively thin crystal of semiconductor material of one conductivity type having a base electrode in good ohmic contact with one of the major surfaces thereof, and a plurality of interleaved emitter and collector electrodes in respective good conductive contact with the other major surface of said crystal, each of said emitter and collector electrodes comprising an activator element for furnishing opposite type conduction carriers fused to and with said other surface to create zones of said opposite conductivity type semiconductor beneath each electrode, the minimum spacing between adjacent zones of said opposite conductivity type being smaller than the minimum spacing between said base electrode and said zones.

References Cited in the file of this patent

UNITED STATES PATENTS

| | | |
|---|---|---|
| 2,561,123 | Kurshan | July 17, 1951 |
| 2,586,080 | Pfann | Feb. 19, 1952 |
| 2,618,690 | Stuetzer | Nov. 18, 1952 |
| 2,644,852 | Dunlap | July 7, 1953 |